US005585723A

United States Patent [19]
Withers

[11] Patent Number: 5,585,723
[45] Date of Patent: Dec. 17, 1996

[54] INDUCTIVELY COUPLED SUPERCONDUCTING COIL ASSEMBLY

[75] Inventor: Richard S. Withers, Sunnyvale, Calif.

[73] Assignee: Conductus, Inc., Sunnyvale, Calif.

[21] Appl. No.: 409,506

[22] Filed: Mar. 23, 1995

[51] Int. Cl.$^6$ ............................................. G01V 3/00
[52] U.S. Cl. ........................................ 324/318; 324/322
[58] Field of Search ........................... 324/318, 321, 324/322; 29/829, 846, 847; 505/192, 202, 220, 329, 844

[56] References Cited

U.S. PATENT DOCUMENTS

| | | | |
|---|---|---|---|
| 5,003,265 | 3/1991 | Leussler | 324/318 |
| 5,247,256 | 9/1993 | Marek | 324/321 |
| 5,258,710 | 11/1993 | Black et al. | 324/309 |
| 5,274,332 | 12/1993 | Jaskolski et al. | 324/318 |
| 5,276,398 | 1/1994 | Withers et al. | 324/318 |

OTHER PUBLICATIONS

Banson, et al., "A probe for specimen magnetic resonance microscopy" (1992) *Invest. Radiol.* 27:157–164.
Johnson, et al., "Histology by Magnetic Resonance Microscopy" (1993) *Magnetic Resonance Quarterly* 9:(1) 1–30.

*Primary Examiner*—Louis M. Arana
*Attorney, Agent, or Firm*—Judith A. DeFranco

[57] ABSTRACT

The invention provides highly sensitive NMR probes for spectroscopy and microscopy. Thin-film superconducting coils on planar substrates are inductively coupled to form an RF transmitter/receiver. Two embodiments are illustrated. The first, which is particularly suited to liquid samples, uses two coils are positioned on opposite sides of a sample, with their long axis parallel to the axis of the sample. The coils are sized and positioned to maximize SNR, field homogeneity or field strength. In the second embodiment, circular coils are deposited on a substrate having a central aperture. Several coils in a solenoidal configuration are positioned orthogonal to and surrounding the sample.

11 Claims, 4 Drawing Sheets

INDUCTIVELY COUPLED SUPERCONDUCTING COIL ASSEMBLY

BACKGROUND OF THE INVENTION

1. Field of the Invention

This invention relates to RF probes for Nuclear Magnetic Resonance spectroscopy and microscopy. More particularly, it relates to resonators for the transmission and reception of NMR signals using a plurality of thin-film tuned coils without ohmic interconnection. More particularly, it relates to pairs of tuned, inductively-coupled RF coils fabricated from a superconducting material.

2. Description of Related Art

In an NMR spectrometer probe, a sample is placed in a static magnetic field, which causes atomic nuclei within the sample to align in the direction of the field. Transmit and receive coils, which may be combined in a single coil or set of coils, are placed in the probe positioned close to the sample. The transmit coils apply an RF magnetic field orthogonal to the direction of the static magnetic field, perturbing the alignment of the nuclei. The transmit signal is then turned off, and the resonant RF signal of the sample is detected by the receiver coil.

The sensitivity of the spectrometer depends on a number of factors, including the strength of the static field, the closeness of the coupling between the RF coils and the sample, and the resistance of the RF coil. Currently, all commercial NMR spectrometers use RF coils made of a normal metal, such as copper, or a combination of normal metals. Much research has been devoted to the design of coils for maximum sensitivity. For example, to achieve close coupling, coils have been made in the form of solenoids, saddle coils and birdcage coils, all of which have very high filling factors. Similarly, researchers have suggested cooling of RF coils to reduce their resistance. However, the sensitivity of conventional normal-metal coils is limited by their resistance, even at low temperatures.

The use of high temperature superconductors (HTS) in place of conventional normal metal for RF coils in NMR spectrometers has previously been suggested. For example, Marek U.S. Pat. No. 5,247,256, describes several RF receiver coil arrangements for NMR spectrometers using superconducting coils. Marek's embodiment differs from the present invention in several respects. In particular, Marek's coils are nonplanar and use ohmic contacts.

The advantage to be obtained with HTS coils is significant. HTS coils would have very low resistance and be operable in the range of 20–100 K., temperatures achievable with currently available refrigeration systems. The quality factor Q of the coil is a useful measure of the coil's efficiency. $Q=\omega L/r$, where $\omega$ is the resonant frequency, L is the inductance and r is the resistance of the coil. Well designed normal-metal NMR coils achieve Qs of about 250. Because of the extremely low resistance of HTS coils, it should be possible to design coils with Qs of 10,000 or more. However, this advantage can only be realized if the other factors necessary for a superior NMR probe, reasonable filling factor and high RF and DC field homogeneity, are met. Thus, the ideal RF probe for NMR would have a transmit/receive coil which would resonate at the desired operating frequency, produce a homogeneous RF field, not significantly disturb the DC field, have a high filling factor (and hence high signal to noise ratio), have a high Q, small parasitic losses and produce a high RF magnetic field at the center of the sample.

Thin-film HTS coils offer design challenges not present with normal-metal coils. The high temperature superconductors are perovskite ceramics which require a well-oriented crystal structure for optimum performance. Such orientation is extremely difficult to achieve on a curved substrate. Thus, thin-film HTS coils are preferably planar, making the achievement of a high filling factor more challenging. It is well known in the art that forming ohmic contacts between an HTS and a normal metal is difficult and generally leads to parasitic losses at the point of contact. Additionally, to the extent a normal metal is used in the coil, resistive losses in the metal elements would lessen the advantages gained from the use of the HTS.

In addition to Marek, others have reported thin-film superconductor RF coils for magnetic resonance applications. For example, Withers U.S. Pat. No. 5,276,398 describes a thin-film HTS probe for magnetic resonance imaging. Similarly, Black U.S. Pat. No. 5,258,710 describes HTS thin-film receiver coils for NMR microscopy. Black discloses several embodiments, including split ring, solenoidal, saddle coils, birdcage coils and coils described as "Helmholtz pairs." Black does not disclose how to form the nonplanar solenoidal, saddle, birdcage or Helmholtz coils in an HTS embodiment.

One possible embodiment using planar components is a pair of parallel coils, one on either side of the sample. When the coils are circular and are separated by a distance equal to half the diameter of each coil, they are known as "Helmholtz pairs." Ordinarily, the coils of a Helmholtz pair are ohmically connected using a wire. They may also be capacitively coupled, as in U.S. Pat. No. 5,258,710. An inductively coupled Helmholtz pair is disclosed in M. B. Banson, et al., "A probe for specimen magnetic resonance microscopy," *Invest. Radiol.* 27, 157 (1992). They report a design for an NMR microscope coil that uses an inductively-coupled copper Helmholtz pair to obtain a uniform magnetic field in the region of the sample.

SUMMARY OF THE INVENTION

It is an object of the invention to provide an RF probe having a higher signal-to-noise ratio (SNR) than is possible with conventional normal-metal probes. It is a further object of the invention to provide a thin-film superconductor RF probe that is easy to manufacture. It is a further object of the invention to provide an RF probe having a uniform RF field strength throughout the sample volume. It is a further object of the invention to provide a transmit RF pulse having an adequate field strength at the sample during transmit.

These and other objects are met by providing an RF probe assembly comprising a plurality of thin-film superconductor coils, each coil being on a planar substrate, with the coils inductively coupled to each other. Preferably, the coils are also inductively coupled to the external electronics using a normal-metal coupling loop. Two embodiments of the invention are disclosed, each providing inductively coupled RF coils on flat surfaces to create a uniform magnetic field throughout the sample. The first provides a pair of coils on opposite sides of the sample. The second provides a plurality of circular coils stacked parallel to each other with a sample volume at the center of the coils in a solenoidal array. Coils that are inductively, but not ohmically, coupled have N well-defined modes of resonance, where N is the number of coils. In the lowest mode, the currents in the coils flow in the same sense (e.g., clockwise) and thus their field contributions add in the space between them, whereas, in the other modes, the currents in the coils have various directions, creating various nulls of zero field. The lowest mode will have exactly the field pattern which would be obtained if the coils were connected with a wire, except that they will lack the generally undesired fields resulting from the connecting elements themselves.

The first embodiment is especially suitable for liquid samples. It provides a probe having pairs of parallel, planar thin-film superconductor coils placed on either side of a sample space, sized and spaced so as to give a high sample filling factor without the use of ohmic connections between the planes. The probe has a very low resultant coil resistance (and consequent high quality factor, Q) and is relatively easy to fabricate. In practice, the coils are placed as close as is possible to the sample volume, parallel to a plane on the y and z axes. The z axis is the direction of the DC magnetic field. The magnetic axis of the coils is, thus, parallel to the x axis, which is orthogonal to the axis of the static magnetic field in which the sample is placed. In the preferred embodiment, the coil is longer in the z direction than in the y direction. Once the distance of the coils from the center of the sample is known, the width of the coils is selected to obtain the best compromise between magnetic field strength and homogeneity. Such a probe would give much higher signal-to-noise ratio (SNR) than the conventional normal-metal probes.

An alternative embodiment, especially suitable for analysis of solid samples, provides a plurality of stacked coils inductively coupled to each other. In this embodiment, each coil is round and is designed to surround the sample volume. That is, the coils are parallel to a plane that lies perpendicular to the sample axis. Both embodiments provide an advantage over the prior an of improved sensitivity while providing easy manufacturability of the probe coils.

These and other advantages and features of the invention are pointed out in the claims annexed hereto and forming a further part hereof. However, for a better understanding of the invention and its advantages reference should be made to the drawings which form a further part hereof and to the descriptive matter in which there is illustrated and described preferred embodiments of the present invention.

BRIEF DESCRIPTION OF THE DRAWINGS

In the drawings, in which like reference numerals and letters indicate corresponding elements in the various views, and in which the drawings are not necessarily to scale.

DESCRIPTION OF PREFERRED EMBODIMENTS

Two-coil "liquids" assembly

In a first embodiment of the invention, a pair of coils are mounted parallel to each other on opposite sides of the sample volume. Each coil consists of a single circular, elliptic, or approximately rectangular loop of thin-film superconductor with at least one capacitor, possibly interdigital, present to make the coil resonant at the desired frequency (which, by itself, will be somewhat higher than when placed into the coupled geometry). Alternately, each coil of the assembly may be a pair of slit annuli on opposite sides of a dielectric, as described by Black U.S. Pat. No. 5,258,710.

Figure 1:
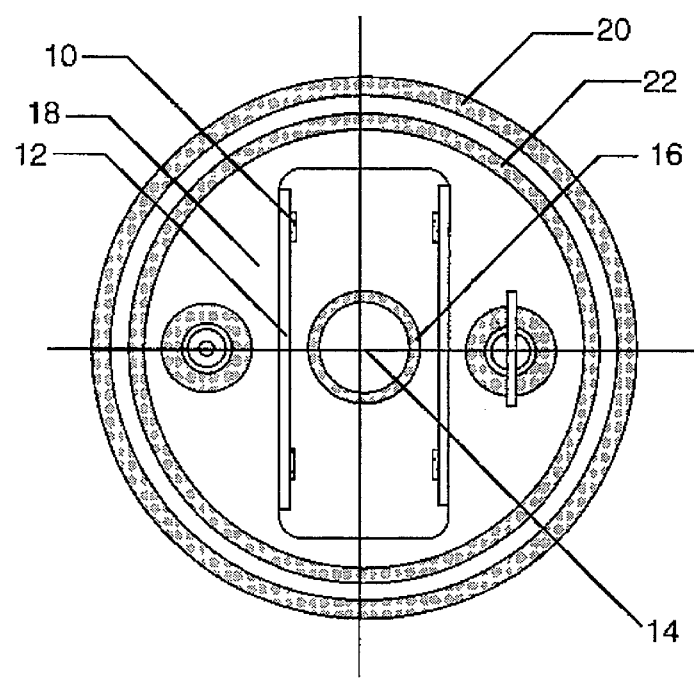
FIG. 1 is a cross-sectional view of an NMR probe of the invention, showing the relationship between the sample space and the members of the pair of coils.
Figure 2:
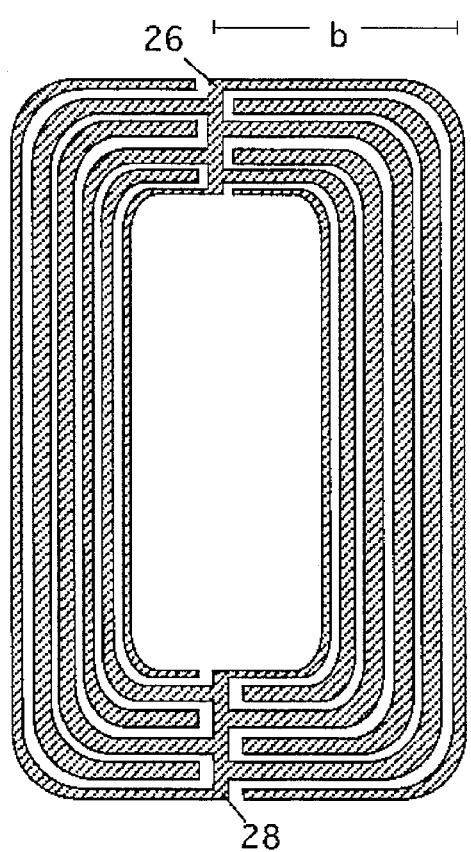
FIG. 2 is a single NMR coil suitable for use in one embodiment of the invention.

A preferred embodiment of the invention is shown in FIGS. 1 and 2. FIG. 1 is a cross-sectional view of the two-coil assembly. Each coil 10 is formed on a planar substrate 12. The coils are positioned within a vacuum space 18 parallel to each other and as close as possible to the sample tube or volume 14 to maximize the filling factor and hence the SNR. An inner vacuum wall 16 separates the coils, which must be kept cold during operation from the sample space 14 which is preferably at room temperature. Preferably, the coils are within 5 mm of the inner vacuum wall. More preferably, the coils are within 3 mm of the inner vacuum wall. The vacuum space may also contain an RF shield 22 to prevent loading by radiation or by warmer, less highly conductive walls and to isolate the coils from external RF fields.

FIG. 2 shows a single member of the NMR coil pair of the invention. The coil is patterned from a thin film of a high temperature superconductor deposited on a planar substrate. The high temperature superconductor may be any of the known perovskite superconductors, such as $YBa_2Cu_3O_{7-\delta}$. The substrate may be sapphire, MgO, $LaAlO_3$, yttria-stabilized zirconia ($ZrO_2$:$Y_2O_3$, also known as cubic zirconia or YSZ), $NdGaO_3$, $SrTiO_3$ or any other substrate suitable for epitaxial growth of the superconductor. Methods of depositing and patterning HTS on substrates are well known in the art and include laser ablation, sputtering and vapor phase deposition.

The coil is preferably comprised of two separate patterns 26, 28 forming an inductor with two interdigital capacitors distributed in series throughout the inductor. The inductance and capacitance are selected to obtain the desired RF frequency for the coil, taking into account the effect of their mutual inductance on the RF frequency.

Figure 3:
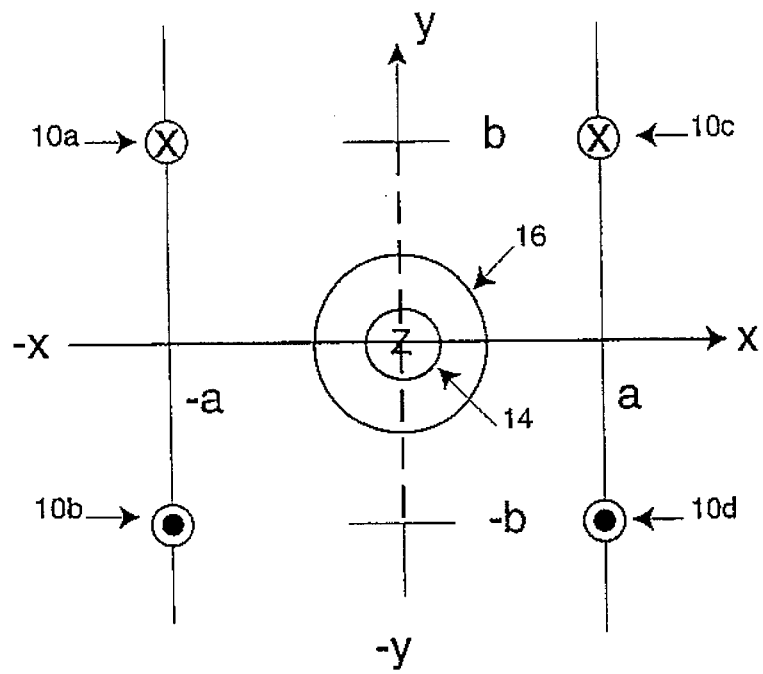
FIG. 3 depicts the relationship of the coils of the invention to the magnetic field and sample.

FIG. 3 depicts the geometry of the coil assembly. The DC field, z, as well as the sample holder 14, is perpendicular to the plane of the drawing. Sample holders for NMR spectroscopy are available in several diameters. Typical sample holders are 5 mm or 10 mm in diameter. The distance a of the coil from the center of the sample is determined by the diameter of the sample holder, the thickness of the vacuum wall and the closeness of the coil to the vacuum wall. In a probe for a 5 mm sample holder, a would preferably be from 4 to 9 mm.

A first coil 10a, 10b, with current entering the plane of the drawing at 10a and exiting at 10b is at a distance −a from the center of the sample space. A second coil 10c, 10d with current entering the plane of the drawing at 10c and exiting at 10d is at a distance a from the center of the sample space. Once the distance a from the center of the sample space to the coil is set, the RF magnetic field generated by the coil at the sample position—and hence, by reciprocity (assuming invariant coil resistance), the SNR—is maximized by choosing the proper coil diameter or width $2b$, where b is the distance from the center of the coil to the edge. For additional current-handling capacity, each coil on either side of the sample might be a closely spaced stack of nominally identical tuned loops, in which case the capacitance of each loop in the stack must be reduced to maintain the desired resonant frequency. In the probe assembly, the coil lies in a y-z plane, where the z axis is parallel to the static magnetic field, $B_0$, of the system and the x and y axes orthogonal to the z axis and each other. The coil is preferably longer parallel to the z axis than its width along the y axis.

In FIG. 3, we assume, as is commonly the case for NMR spectroscopy, that the sample is much longer along its axis (z) than transverse to its axis (the x-y plane). The DC polarizing field $B_0$ is parallel to z. The coils, which are in y-z planes offset by a distance $\pm a$ from the center along axis x, are made longer in z than their width, $2b$, in the y direction. It is desired to maximize the RF magnetic field H generated by the coil assembly in the x direction (the coils' magnetic axis) at the center of the sample. Because the coils are long in z, we neglect the y-directed current (at the $\pm z$ extremities of the coils, not shown) and consider only the z-directed current, with the implicit assumption that the coil is infinite in z. In this case, assuming a current "I" in both coils, the field at the center (x=0, y=0) can be shown to be $$H = (2I/\pi)\, b/(a^2+b^2).$$

The offset a is dictated by thermal and mechanical factors. That is, because the superconductor must be kept at a low temperature, preferably $\leq 50$ K., and the sample is preferably at about room temperature, the coil is typically separated from the sample space by vacuum wall 16, shown in FIG. 1. Subject to the constraints of the probe geometry, the distance a is minimized. From the above equation, it can be shown that the maximum magnetic field H is obtained for a choice of coil half-width $b=a$; in other words, the coil diameter should be equal to the spacing between the coils.

Field uniformity, on the other hand, is optimized when the coil half-width $b=\sqrt{3}\, a$. With this width, the first and second derivatives of the x-directed field with respect to both x and y vanish at the center. (Actually, all odd derivatives vanish, because the field is an even function of both x and y.)

The other extreme of round coils can also be considered. We assume two coils of radius b, each in the yz plane at a distance along the x axis of $\pm a$ from the midpoint. For a current I in both coils, the field at the sample center is $$H = I/\{b[1+(a/b)^2]^{1.5}\}$$

which has a maximum for a coil radius $b=\sqrt{2}\, a$. This is somewhat narrower than the Helmholtz spacing $b=2a$ with which field uniformity is optimized. It can be shown that, with the Helmholtz spacing, the first and second derivatives of the x-directed field with respect to x vanishes at the coil center. In addition, both the first and second derivatives with respect to radius (away from the x axis) vanish with the Helmholtz geometry.

Both of the above SNR arguments are based on a reciprocity principle which says that SNR is proportional to $H/\sqrt{R}$, where R is the effective series resistance of the coil. The resistance should decrease somewhat for smaller coils, which would result in an optimum coil size for SNR maximization that is somewhat less than that calculated above. The effect of coil size on resistance is small for the long rectangular coil set, because most of the resistance is presented by the long z-directed elements which do not change with a change in width. The effect is greater when the coil is circular; in fact, if we assume that resistance is proportional to the coil diameter (maintaining a constant linewidth), we find a maximum SNR at a radius $b=a$. It may also be reasonable to assume that coil Q is independent of size, so that a calculation that maximizes $H/\sqrt{L}$, where L is the coil inductance, would give the optimum dimension. Depending on the requirement for RF uniformity, a compromise between the SNR optimization and the optimum for uniformity may be made.

It is noteworthy that, by maximizing the field H for a given current I, we produce a coil with optimum capability of delivering short excitation pulses to NMR samples. This is an important specification in spectroscopy, and, because the current-carrying capability of superconducting films is limited, it is necessary to consider the H/I ratio of a coil design.

The geometries for optimizing H/I, SNR, and RF homogeneity are summarized in the table below.

| Coil geometry | H/I | SNR | RF homogeneity |
| --- | --- | --- | --- |
| Long | $b = a$ | $b \leq a$ | $b = \sqrt{3}\, a$ |
| Circular | $b = \sqrt{2}\, a$ | $b = a$ | $b = 2a$ |

In operation, the sample under study (either spectroscopic or microscopic) is placed between the two coils so that it is approximately centered between them and has its long axis, if any, aligned with the long axis of the coil, if any. The coils are kept at a low temperature (<100 K.) and the sample is maintained at an appropriate temperature by methods described by Kotsubo, et al., U.S. Ser. No. 08/297,352, which is incorporated herein by reference. RF power is applied to the coupling loop at the lower mode of resonance, preferably through a transmit/receive (T/R) switch, so that the spins within the sample are excited. At an appropriate time after the transmit pulse, the T/R switch is put into the receive mode, so that signals are coupled from the sample to the low-noise preamplifier and from there to the system at large. Any pulse sequence appropriate to spectroscopy or imaging may be used. Such sequences are known to those skilled in the art.

Figure 4:
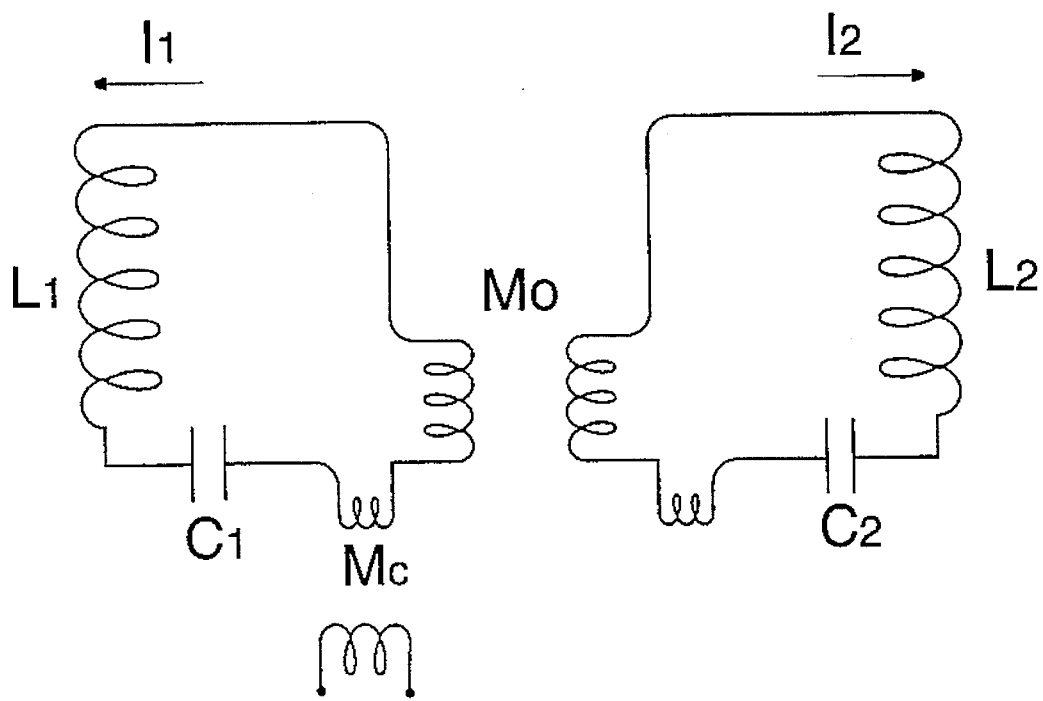
FIG. 4 depicts the equivalent circuit of the coil pair of FIG. 3.

The electrical equivalent circuit of the two-coil assembly is shown in FIG. 4. The coils have self-inductances $L_1=L_2=L$ and each is tuned with a capacitance $C_1=C_2=C$. The two are coupled by a mutual inductance $M_0$, and the coil set is coupled to the preamplifier (and possibly transmit amplifier) through a coupling inductance $M_c$ to a loop on the end of a cable. Although asymmetric coupling to the cable feed is shown here by way of illustration, other means of coupling to the external electronics, including symmetric inductive coupling and ohmic connection are within the scope of the invention. The resonant angular frequencies of the coil assembly can be shown to be $$\omega = [C(L \pm M_0)]^{-0.5}.$$

In the lower-frequency mode of interest here, $I_1=I_2$, whereas in the higher-frequency mode, $I_1=-I_2$. Typical frequency spreads, $(\omega_{high}-\omega_{low})/[(\omega_{high}+\omega_{low})/2]$, are 5%, indicating that $M_0 \approx 0.05\, L$.

Solenoid-like multi-coil "solids" assembly

Figure 5:
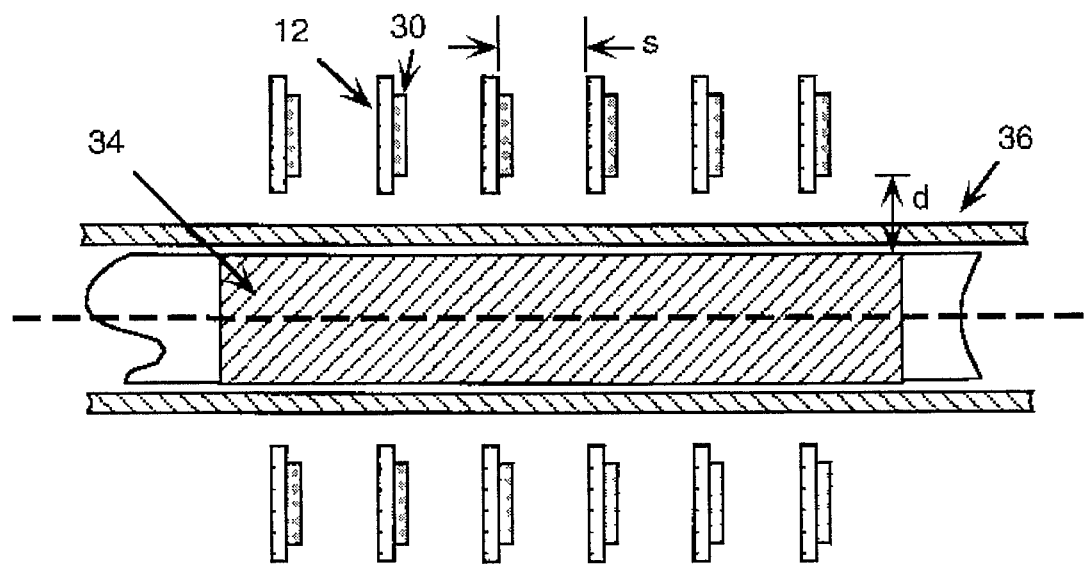
FIG. 5 depicts a second embodiment of the invention using solenoidal coils.

FIG. 5 illustrates a solenoid-like assembly that is amenable to solids spectroscopy. A stack of circular coils 30 spaced a distance s apart surround a sample 34. The inside edge of the coils are a distance d from the sample space. As with the two-coil probe, it is desirable to minimize the separation of the coil from the sample. Mechanical factors, such as need for a vacuum wall 36 dictate the minimum distance d. In the case of the solenoidal assembly, it is desirable to use several coils in the stack, with the number dependent upon the required RF field homogeneity, RF field strength, the coil spacing s and the sample size.

The solenoid-like assembly may be arranged so that the magnetic axis of the stack of coils $B_1$ is also the axis of the sample, unlike the two-coil probe assembly in which the magnetic axis and sample axis are substantially orthogonal. The sample axis, and hence the magnetic axis of the coils, would then be aligned at a preferred angle with respect to $B_0$, such as at the "magic" angle often used in solids spectroscopy. The sample may be spinning rapidly.

Figure 6:
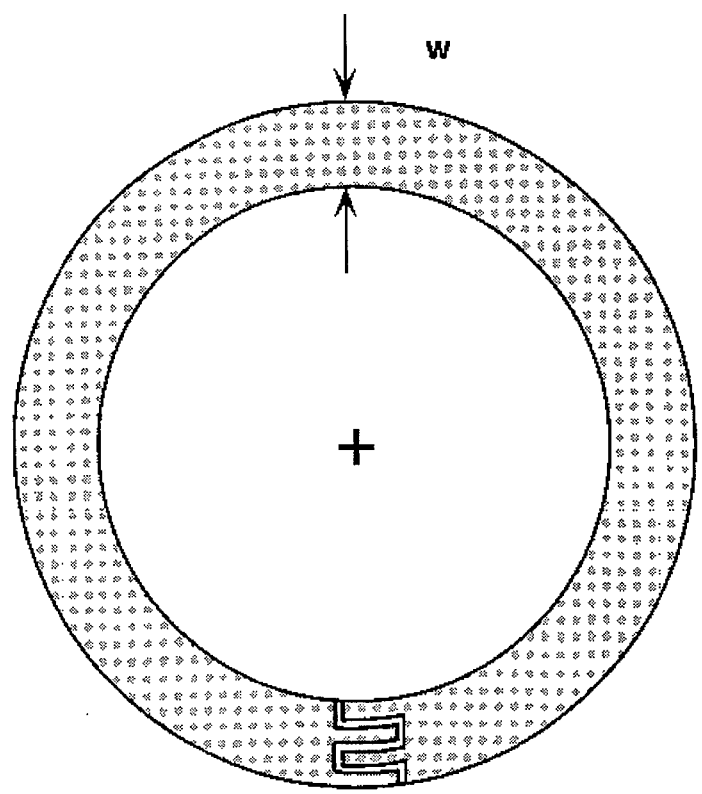
FIG. 6 depicts a single coil suitable for use in a second embodiment of the invention.

FIG. 6 depicts a single coil suitable for use in the solenoidal embodiment of the invention. Each coil is tuned with an integral, preferably interdigital, capacitor 32. The dimensions of the inductors and capacitors are selected to obtain the desired resonant frequency when all of the coils are coupled. The coil has a width w. As with the two-coil assembly, the coil assembly may be inductively or, with more difficulty, capacitively coupled to the transmit/receive system. The sample-to-coil separation d is made as small as permitted by thermal and mechanical considerations. The coil-to-coil separation s is determined by the required uniformity of RF field over the sample volume, and the coil width w is then determined by the required amplitude of transmit RF field. Other than the last condition, which involves the current-carrying capability of superconducting films, methods used in the design of conventional helical solenoids may be used.

Figure 7:
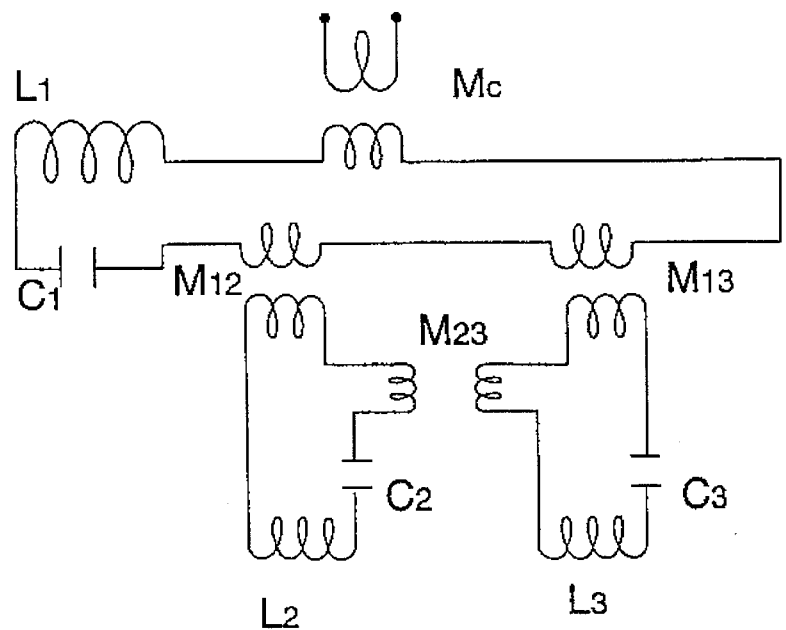
FIG. 7 depicts the equivalent circuit of the coil of FIG. 5.

The electrical equivalent circuit of a 3-turn version of a multi-coil solenoidal stack is shown in FIG. 7. Because each coil is coupled to every other by some mutual inductance, the equivalent circuit is very complex for more than a few coils. With N coils, there will be at least N modes of resonance. However, one critical feature is that, in the lowest-frequency mode of the assembly, the contributions of all coils will add throughout the sample volume. Thus, the stack functions as a solenoid. It should be noted that, although all currents have the same sense of direction (i.e., clockwise), they may not be of equal magnitude, especially in the outer coils.

With a few simplifying assumptions, some estimate of coil frequency can be obtained. Assume that each coil has a capacitance C, a self-inductance L, and equal mutual inductances M to every other coil. In this case, we find equal currents flowing in each coil in the solenoidal mode, at an angular frequency $$\omega=\{C[L+(N-1)M]\}^{-0.5}.$$

Figure 8:
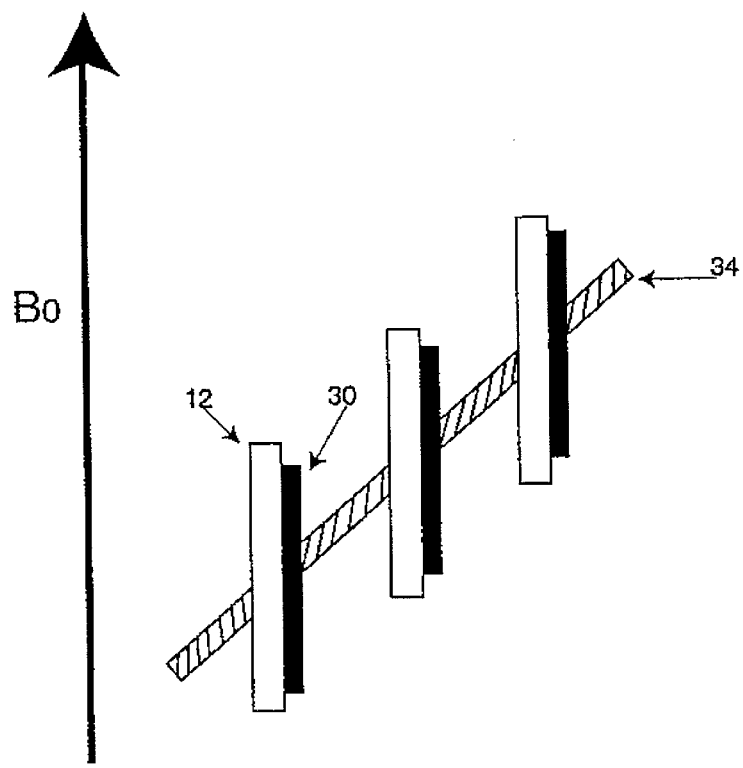
FIG. 8 depicts another embodiment of the invention using solenoidal coils.

A more accurate solution is fairly straightforward, requiring reasonable assumptions about the mutual inductance between nearest neighbors, next-nearest neighbors, and so on. Algebraic solution of the series equations yields the resonant frequency and thence the current distribution in the coils, from which uniformity is be determined. The capacitance of each coil can be adjusted to force a desired current distribution while maintaining the desired resonant frequency;

FIG. 8 depicts an alternative embodiment of the solenoid-like coils. In this embodiment, which also uses circular coils 30 on planar substrate 12 stacked parallel to each other, the coils are arranged so that the plane of each coil is parallel to the static magnetic field $B_0$, making the RF field of the coils orthogonal to the static field, but at an angle to the sample 34. The apertures of the coils are aligned to provide a space into which a sample may be inserted. The alignment may be at any desired angle relative to the static magnetic field.

CONCLUSION, RAMIFICATIONS AND SCOPE

It will be apparent to those skilled in the art that inductively-coupled, thin-film, high temperature superconducting NMR probe coil assemblies offer significant advantages over the probe coil assemblies that were heretofore available. Using a superconducting coil makes possible probes having Qs of 10,000 or more; greater than an order of magnitude improvement over Qs available with the best-designed normal-metal probe assemblies.

It will be appreciated by those skilled in the art that a number of variations are possible within the spirit and scope of the invention. For example, the invention is equally applicable to low temperature superconductors. While low temperature superconductor coils do not offer the advantages of operating temperatures above 20 K., they are capable of achieving the extremely high Q. It will also be appreciated that, in the "two-coil assembly" each member of the pair of coils may be a set of tuned coils, which are themselves either inductively or capacitively coupled. It will further be appreciated that, depending upon the objectives of the designer, the coil may be optimized for maximum SNR, maximum field-to-current ratio or field homogeneity by selection of the ratio of coil width to separation.

Coils designs other than those disclosed are within the scope of the invention, provided the coil assembly is resonant at the desired frequency. Where it is desired to have a multi-element probe, two or more pairs of coils, each resonant at a desired frequency, may be incorporated into a single probe. Alternatively, additional reactive elements may be added to each substrate to make the coil assembly resonant at multiple frequencies. Further, it will be appreciated that the invention is useful both for NMR spectroscopy and microscopy.

While the foregoing disclosure contains many specificities, it should be understood that these are given by way of example only. The scope of the invention should not be limited by the specific examples given above, but only by the appended claims and their legal equivalents.

I claim:

1. An RF probe for use in magnetic resonance spectroscopy, the RF probe being inserted in a magnetic field having a DC polarizing, field $B_0$, and a sample volume having an axis parallel to the DC field comprising:

(a) a first planar substrate on one side of the sample volume, wherein the first substrate has a length and a width, the length is parallel to the DC polarizing field and the width is orthogonal to the DC polarizing field and to an axis extending from the first substrate through the axis of the sample volume;

(b) a second planar substrate parallel to the first planar substrate on the opposite side of the sample volume;

(c) a first coil formed from a thin layer of a superconductive material on one side of the first planar substrate, the first coil having an inductive element and a capacitive element;

(d) a second coil formed from a thin layer of a superconductive material on one side of the second planar substrate, the second coil having an inductive element and a capacitive element; the coils being separated by a distance from the axis of the sample volume, whereby the first coil is inductively coupled to the second coil.

2. The probe of claim 1, wherein the capacitive element comprises a plurality of interdigitated electrodes distributed throughout the inductive element.

3. The probe of claim 1, wherein each of the coils has a width and a height, the width is orthogonal to axis z and the height is parallel to axis z and the width is less than or equal to the height.

4. The probe of claim 3, wherein the width of each coil is less than or equal to twice the distance of the coil from the center of the sample space.

5. The probe of claim 1, wherein the first coil comprises a plurality of essentially identical coupled resonators.

6. The probe of claim 1, further comprising an output coupling coil inductively coupled to the first coil for carrying a transmit signal to and receiving a response signal from the coil assembly.

7. The probe of claim 6, wherein the output coil comprises a normal-metal loop.

8. The probe of claim 1 further comprising a third and a fourth coil on the first and second substrate, respectively, wherein the third coil is inductively coupled to the fourth coil, and the third and fourth coils have a resonant frequency which frequency is different form a resonant frequency of the first and second coil.

9. The probe of claim 1 wherein the axis of the sample parallel to the DC field is substantially longer than axes perpendicular to the DC field.

10. An RF probe for use in magnetic resonance spectroscopy, the RF probe being inserted in a magnetic field having a DC polarizing field, the probe comprising:

a plurality of planar substrates, each substrate having an aperture therein, the substrates being parallel to each other and separated by a distance (s);

an essentially circular coil on each of the substrates, each of the coils surrounding the aperture, the coils having an outer edge and an inner edge, the outer edge and the inner edge being separated by a width (w) and the inner edge having a radius (d);

the apertures being aligned so as to form a sample space extending through the center of and orthogonal to each substrate wherein each of the circular coils comprises an inductive element and a capacitive element, the capacitive element comprising interdigitated elements extending from the inductive element.

11. An RF probe for use in magnetic resonance spectroscopy, the RF probe being inserted in a magnetic field having a DC polarizing field, the probe comprising:

(a) a of thin-film circular superconducting coils, each of the coils being deposited on a planar substrate, each of the coils having a capacitive element and an inductive element, each of the coils being parallel to the DC polarizing field and adjacent coils being separated from each other by a distance (s);

(b) an aperture in each of the substrates, centered at the center of the coils, the apertures being aligned so as to form a sample space extending through the center of each substrate; and (c) the sample space being at a selected angle to the DC polarizing field, wherein the selected angle is not perpendicular to the DC polarizing field.

* * * * *